(12) United States Patent
Morgan

(10) Patent No.: US 6,530,073 B2
(45) Date of Patent: Mar. 4, 2003

(54) RTL ANNOTATION TOOL FOR LAYOUT INDUCED NETLIST CHANGES

(75) Inventor: David A Morgan, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 122 days.

(21) Appl. No.: 09/847,838

(22) Filed: Apr. 30, 2001

(65) Prior Publication Data

US 2002/0162086 A1 Oct. 31, 2002

(51) Int. Cl.[7] .............................................. G06F 17/50
(52) U.S. Cl. ................. 716/18; 716/4; 716/5; 716/6; 716/10
(58) Field of Search ............................. 716/18, 5, 6, 10

(56) References Cited

U.S. PATENT DOCUMENTS

| | | | |
|---|---|---|---|
| 5,493,508 A | | 2/1996 | Dangelo et al. |
| 5,572,436 A | | 11/1996 | Dangelo et al. |
| 5,572,437 A | * | 11/1996 | Rostoker et al. ............... 716/18 |
| 5,581,738 A | | 12/1996 | Dombrowski |
| 5,644,498 A | | 7/1997 | Joly et al. |
| 5,687,088 A | | 11/1997 | Tomita |
| 5,715,170 A | | 2/1998 | Nakamori |
| 5,734,572 A | | 3/1998 | Guignet |
| 5,751,596 A | | 5/1998 | Ginetti et al. |
| 5,867,399 A | | 2/1999 | Rostoker et al. |
| 5,870,308 A | | 2/1999 | Dangelo |
| 5,910,897 A | * | 6/1999 | Dangelo et al. ............... 716/18 |
| 5,991,523 A | * | 11/1999 | Williams et al. ............... 716/18 |
| 6,192,504 B1 | * | 2/2001 | Pfluger et al. ................. 716/18 |
| 6,219,821 B1 | | 4/2001 | Hagerman et al. |
| 6,226,777 B1 | * | 5/2001 | Zhang .......................... 716/18 |
| 6,366,874 B1 | * | 4/2002 | Lee et al. ..................... 716/18 |
| 6,442,738 B1 | * | 8/2002 | Brehmer ...................... 716/18 |

OTHER PUBLICATIONS

Cadence Unwraps all–in–one chip design tool—Author(s)—Goering.

\* cited by examiner

*Primary Examiner*—Michael Tokar
*Assistant Examiner*—Lam T. Mai

(57) ABSTRACT

A Register Transfer Language (RTL) annotation software tool that: (1) automatically calculates new RTL of a circuit to facilitate subsequent RTL level Engineering Change Orders (ECOs) on a circuit where gate level changes have occurred during layout; and (2) automatically calculates a gate level netlist that corresponds to the RTL ECO which can be fed to modern layout tools with minimal disruption to the existing layout. In a preferred embodiment, the tool is software driven, iterative, and tracks any changes that need to be made for any given circuit described by a hardware description language (HDL) though a series of intermediate and preliminary data files. The software receives input in the way of user input, constraints, and an RTL description for a pre-ECO circuit, and outputs the post-layout annotated RTL description. Subsequent ECOs are taken as input from the user in the form of a modified annotated RTL description and the software produces a corresponding gate level netlist for the ECO circuit, all the while preserving as much of the data generated during this process to avoid wasteful duplication of effort.

39 Claims, 5 Drawing Sheets

RTL ANNOTATION TOOL FOR LAYOUT INDUCED NETLIST CHANGES

BACKGROUND OF THE INVENTION

1. Field of Invention

The present invention relates generally computer-aided design (CAD) tools such as Electronic Design Automation (EDA) tools, hardware description languages, and logic synthesis for electronic circuit design.

2. Description of Related Art

Modern digital design of complex circuits and systems, which can contain millions of interconnected gates, involves a number of techniques for manageable design. Tools using CAD, EDA, hardware description languages (HDL), logic synthesis, hierarchy design, and "divide and conquer" strategies such as top-down design are employed.

A hardware description language (HDL) representation of a circuit is a representation of a circuit in text rather than graphically, enabling a more uniform, portable representation of the circuit, one that can be manipulated by a computer program. Currently, Verilog and VHDL are two major standards of HDLs. HDL may be stylized into "structural" (e.g. at the gate-level), "behavioral" or "dataflow" (typically at the higher level description of a circuit), or any combination of the above. HDL representations are used in logic synthesis, the conversion of a high-level electronic circuit description into a list of logic gates and their interconnections, called the "netlist".

An HDL description of a system can be written at an intermediate level language referred to as a Register Transfer Level (RTL). A subset of RTL that is used by logic synthesis tools (such as Synopsys' DesignCompiler and Cadence's Ambit) is known as "synthesizable RTL". A logic synthesis tool with a library of components can convert a RTL description into an interconnection of primitive components that implements the circuit, subject to any specified constraints, such as timing, speed, power consumption and area constraints. Typically, these constraints are specified by the designer of the circuit. The output of the logic synthesis tool, after an optimization process referred to as technology mapping, is a so-called netlist of interconnected storage elements, gates, and other functional blocks (note the term "net" is also a keyword in Verilog, and represents a data type comprising a physical connection between structural elements). The netlist output serves as input to physical design tools that physically place the logic elements and route the interconnections between them to produce a manufacturing circuit layout. When programmable parts are employed, such as field-programmable gate arrays, binary information is produced by design tools to program the logic within the parts.

Hierarchy design involves following an inverted tree in design, with the top-level design of the circuit at the root and more increasingly specific levels of detail at the branches and leaves below. Functional blocks (or modules, with the term "module" also a keyword in Verilog HDL) are employed at the upper echelons of the tree, while primitive blocks (such as NAND gates) are employed at the lower echelons. In theory the design process is "top down", where the circuit function is specified by text, with constraints on cost, performance and reliability, and then the circuit is designed by repeatedly dividing it into blocks as necessary. In practice, in order to obtain reusability and to make maximum use of predefined modules, it is often necessary to perform portions of the design bottom up. In addition, bottom up design is sometimes necessary to eliminate violations of constraints in a preliminary specification. When a preliminary original design of a circuit has to modified or changed it is termed an engineering change order (ECO), and the subsequently modified or changed original design of the circuit may be termed a modified circuit, post-layout annotated circuit, post-layout circuit, or ECO circuit.

The term ECO (Engineering Change Order) is commonly used to represent a variety of concepts. An ECO may refer to a functional change, in which the functionality of the circuit has changed and is no longer logically equivalent to the pre-ECO (original) design. An ECO may also refer to a non-functional change, in which the new design remains functionally equivalent to the original design. Typically non-functional type of changes are made in order to change the timing behavior of the circuit, or to accommodate manufacturability issues encountered during layout (e.g., overloaded cells that result in signal ramp times that are outside the characterized range of operation of the cell). Non-functional changes in an ECO may be introduced by the designer, the layout engineer, or by CAD tools during physical implementation (layout).

There are several categories of non-functional ECO changes in a circuit: physical-only transformations and gate-level transformations. Physical-only non-functional ECO changes are not reflected in the gate-level netlist. Examples of non-functional physical-only ECO changes are changing the placement of a cell, re-implementing the routing of a signal/net, or modifying the physical location of physical pins. A gate-level non-functional ECO transformation is a type of change that may change the gate level netlist by the introduction of new cells, swapping of cells for different drive strength logically-equivalent cells, or local logic restructuring (i.e., re-synthesis of a specific logic cone to create an alternative gate-level representation).

ECO changes submitted after a significant amount of physical implementation has occurred are very problematic, given today's commercial Electronic Design Automation (EDA) tool offering. Since the physical realization (placement, routing and physical optimization) of a design for large circuits may involve months of engineering effort and many resources (both software and hardware), preserving as much of the prior physical implementation as possible is of paramount importance when incorporating logic changes into a design once physical implementation has begun. While today's physical design tools offer some capabilities for dealing with ECOs, they are not capable of preserving netlist changes that have been introduced during layout. Specifically, today's physical design tools allow comparison of the netlist representation inside of the tool's database with an external gate-level netlist. As a result of this comparison, the physical design tool identifies changes that must be made to the database (i.e., deletion/addition of cells and deletion/addition of connections between the cells) to make the database consistent with the external netlist. For ECOs that are implemented manually at the gate-level by the designer (as opposed to modifying the source RTL and creating a new gate-level netlist through logic synthesis), this mechanism works fine as long as the modifications are made to the post-layout netlist from the previous iteration of the layout.

However, this approach to introducing ECOs to a design has several significant drawbacks:

(1) The source description of the design is generally considered the HDL/RTL, not the gate-level netlist. Maintaining an accurate representation of the design in RTL is critical to ensure that future generations of a design can leverage the current design description (i.e., migration from one technology to another, specialization/generalization of a design, integration of the design into a larger design). Functional modifications made at the gate-level cannot be easily propagated to the new generations of a design.

(2) If the ECO is manually implemented in the gate-level netlist, the gate-level netlist is no longer guaranteed to be functionally equivalent to the source RTL (since it was not technically feasible to manually implement an equivalent change at the RTL level, this technically feasible to manually implement an equivalent change at the RTL level, this is often extremely difficult to do, and generally requires use of formal verification tools to ensure that the changes are truly equivalent.

(3) For large-scale functional changes to functional blocks/modules, it may be impractical to manually make the changes at the gate-level. What would require relatively minor change to the RTL could result in massive changes necessary at the gate-level. Under these circumstances, the designer is generally forced to throw away the previous layout, even if the changes are isolated to only a small portion (functional block) of the design.

Therefore, there is a need for a way to make functional changes to a design at the RTL level, while providing a mechanism to preserve as much of the existing physical implementation as possible.

A partial solution to this problem was provided with the introduction of Synopsys' ECO Compiler tool. It allowed a designer to preserve portions of a gate-level implementation for a design that had been re-synthesized from a modified RTL. It took the original RTL and the corresponding gate-level netlist generated via logic synthesis, and a new (modified) RTL and the corresponding gate-level netlist generated via logic synthesis, and created an output gate-level netlist that preserved all the gate-level implementation for functional blocks that did not change at the RTL level. This was necessary because even though the RTL description for these blocks may not have changed going into re-synthesis, there is no guarantee that successive runs of a logic synthesis tool will result in identical gate-level implementations for a given set of RTL code. With Synopsys' ECO Compiler, the idea was that the output gate-level netlist would only have new gate-level representations for those functional blocks where the RTL had changed, and the rest of the blocks (modules) would use the original gate-level implementation.

Unfortunately, Synopsys' ECO Compiler did not account for the fact that once a design goes into the physical design process, the gate-level netlist changes. While the changes introduced by the physical design tools are guaranteed to preserve functional equivalence at that design level, they can significantly modify the interfaces (input, output, and inout ports) for intermediate hierarchical modules in the design. This results in false mis-compares for virtually every functional block in the design for real deep sub-micron designs where clock tree synthesis, repeater insertion and significant physical optimization are required to realize the design. Alternatively, ECO Compiler could be run using the pre-layout gate-level netlist originally produced by the logic synthesis tools, meaning that all the changes made by the physical design tools would be lost.

The essence of the problem is the post-layout gate-level netlist from the current layout (which incorporates all the changes made by the physical design tools) cannot serve as the "original" gate-level netlist for Synopsys' ECO Compiler because ECO Compiler cannot establish the correspondence between the "original" RTL modules and the post-layout gate-level modules due to differences in the module interfaces (ports). In fact, even full-fledged modern formal verification tools have difficulty dealing with this problem. Instead of trying to resolve these types of mismatches at each level of logic hierarchy, today's formal verification tools "flatten" the design hierarchy when intermediate module interfaces do not match with the "reference" design in order to check across hierarchical boundaries. Since the whole ECO Compiler solution hinges on proper identification of hierarchical modules that have not changed, flattening the logic hierarchy undermines the ability to accomplish this, and therefore incorporating formal verification techniques into ECO Compiler would still not address the problem.

However, if there were a way to create an RTL description that is consistent with the post-layout gate-level netlist module structure, then we could utilize a tool like ECO Compiler in conjunction with existing physical design tools to preserve the layout for portions of the design where no functional changes are required at the RTL level.

Another problem arising from changes introduced by physical design tools relates to the management of design constraints (e.g., timing constraints) between pre- and post-layout design representations. Constraints, which may be created in the context of an HDL description, are sometimes difficult to interpret at the gate-level hierarchy, which may have a different interface (i.e., a module port) for a module/block than the higher hierarchy RTL description of the same circuit. Thus tools must translate constraints so they can be shared between the gate-level and RTL descriptions of the design, and to facilitate subsequent ECOs introduced at the RTL level. If the RTL is not modified to match the gate-level module descriptions, then a separate set of constraints must be maintained at the gate level and the RTL level, and there is currently no tool to aid the designer in ensuring correspondence between the two different sets of constraints.

As the complexity of designs increase, designers employ a plurality of disparate tools to deal with the design of electronic circuits, in particular dealing with timing, such as employing timing optimization tools, such as Avant!'s Apollo™ or Cadence's Silicon Ensemble™, and ECO synthesis tools, such as by Synopsys' ECO Compiler™. One of the aspects of the present invention is to realize that these tools can be combined with a single comprehensive tool that can modify the design netlist without the need for a plurality of such tools and without the need for wasteful time consuming operations or excessive manual intervention. A further aspect of the present invention is to use it as a "glue" software tool that sits between the existing software tools, to allow these tools to work together to facilitate incorporation of logic changes (functional ECOs) into an existing physical implementation, without restart the layout process. In addition, application of the principals described herein with either implementation, will ensure correspondence between the design description and constraints at the different levels of abstraction (HDL/RTL versus gate-level).

SUMMARY OF THE INVENTION

An aspect of the present invention is to provide an electronic design automation (EDA) software tool to facilitate gate-level timing optimization and provide a seamless interface for Engineering Change Orders (ECO) once physical design implementation (layout) has started.

Another aspect of the present invention is to provide for a management tool for netlists, and to create an annotated RTL netlist that matches the hierarchical structure (i.e., module interfaces) for all intermediate levels of logic hierarchy.

Yet another aspect of the invention is to provide for automatic and semi-automatic modification of constraints, such as timing constraints, in a post-layout circuit, given a pre-layout circuit and constraints related to the pre-layout circuit.

The above described features and many other features and attendant advantages of the present invention will become apparent from a consideration of the following detailed description when considered in conjunction with the accompanying drawings.

BRIEF DESCRIPTION OF THE DRAWINGS

Detailed description of preferred embodiments of the invention will be made with reference to the accompanying drawings.

DETAILED DESCRIPTION OF THE PREFERRED EMBODIMENTS

Disclosed herein is a detailed description of the best presently known mode of carrying out the invention. This description is not to be taken in a limiting sense, but is made merely for the purpose of illustrating the general principles of the invention. The section titles and overall organization of the present detailed description are not intended to limit the present invention.

Figure 1A:
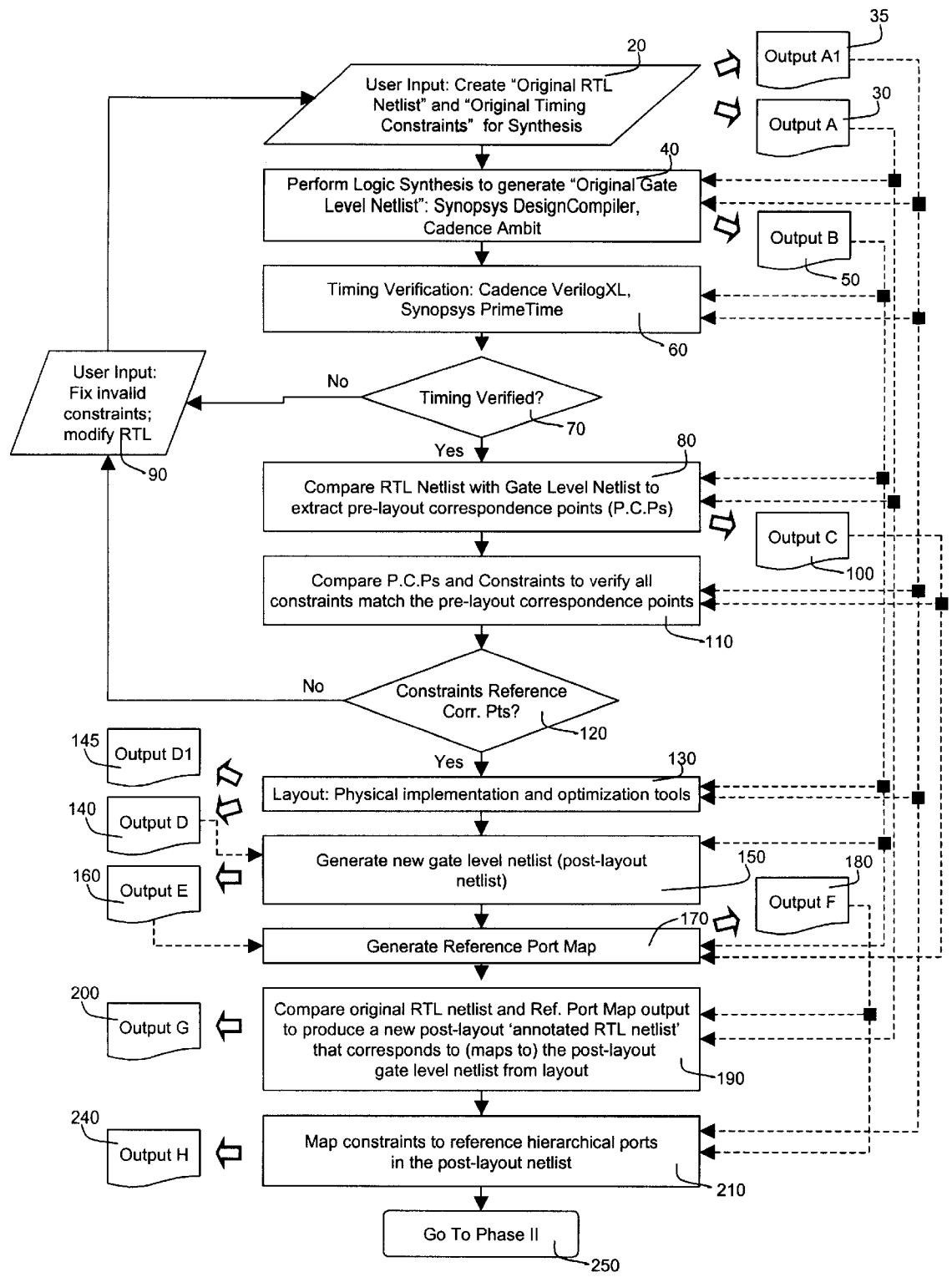
FIGS. 1A and 1B shows a top-level flowchart for a preferred embodiment of the invention.
Figure 1B:
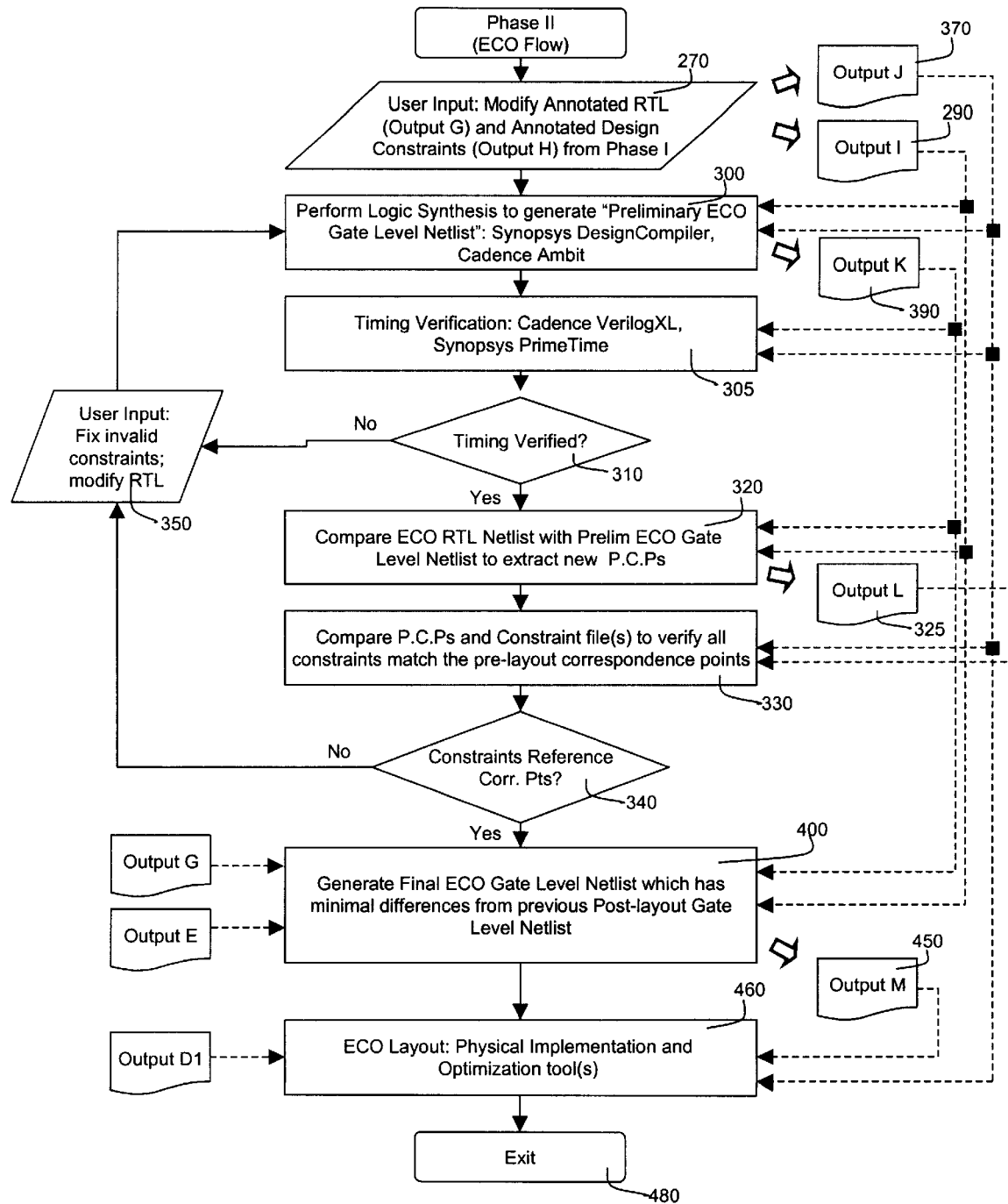

Turning to FIGS. 1A and 1B, there is shown a flowchart for carrying out a generalized software driven RTL annotation tool employing the principles of the present invention. The tool may be written in any computer language and run by a general-purpose computer system, having a processor (s), primary and secondary memory cooperating with the processor(s), and I/O means such as monitor, mouse and keyboard; or any specialized hardware or firmware. Preferably, the computer has ample primary and secondary memory storage (as the technology library that describes the logic elements available for use in a netlist, as well as their delay and loading properties, can be large in size). Depending on the language used to construct and implement the software (which could be any language, such as C, C++, Perl, Java or the like), the software may have any number of classes, functions, objects, variables, templates, lines of code, portions of code and constructs (collectively and generally, "a process step", "step", "block", "functional module" or "software module") to carry out the invention in successive stages as described and taught herein, and may be either a standalone software application, or employed inside of or called by another software application. The software process or software module may be constructed so that one portion of code in the application performs a plurality of functions, as for instance in Object Oriented programming (e.g., an overloaded process). The converse is also true, in that a plurality of portions of code could perform a plurality of functions, and still be functionally the same as a single portion of code. At any stage of the process step of the present invention, intermediate values, variables and data may be stored for later use by the program.

The present invention assumes that this original circuit will be subsequently modified by an ECO, as described below; thus, the original circuit may be termed a "pre-ECO" circuit. The program of the present invention may be broadly and generally classified into two phases. The first phase of the invention, broadly depicted by FIG. 1A, the software generates a correlation between the RTL netlist and the gate-level netlist of a pre-ECO circuit, and after guarantying, with a series of iterations, that any constraints, such as timing constraints, are satisfied, generates a post-layout RTL netlist and a post-layout gate-level netlist. The second phase of the invention, broadly depicted by FIG. 1B, the software works with an ECO circuit, and accommodates any ECO changes made by a user so that work done in phase I is not lost, that there is automatic mapping of design constraints, and that there are preserved physical implementations between ECO iterations without having to restart the entire design process.

Thus in the first phase of the program, phase I, as depicted by the flow diagram of FIG. 1A, the original description of the original circuit undergoes a significant amount of transformation when generating the layout and physical implementation of the circuit, going from RTL netlist to gate-level netlist, with changes possible to the constraints associated with the circuit as well, such as timing constraints. The transformations are preserved in a series of intermediate output files (e.g., databases, or more generally data, which may be stored in either secondary or primary memory) for later use by the second phase of the program, phase II, as depicted by the flow diagram of FIG. 1B, where ECO changes are made to the circuit.

Turning attention now to FIG. 1A, at the first software module process step, block 20, (note in general any step or block can comprise a software module that performs one or more particular function(s)), a RTL netlist (output A) for the original circuit is generated from the HDL description of the original circuit (not shown). The RTL netlist may also be derived in response to user input from inside the software tool, such as shown in block 20, or it may have been derived a suitable external software tool, and is output to a file, as shown by output A in reference number block 30, for later use (as indicated by the dotted lines). The RTL netlist may be a synthesizable RTL code description of the circuit that is in suitable form to be fed to a logic synthesis tool such as Synopsys' DesignCompiler or Cadence's Ambit. In addition, the initial set of design constraints are defined (output A1) which drive the synthesis and layout tools, as illustrated in block 35.

Using the RTL netlist, the software of the present invention then performs logic synthesis at software module process step block 40, which may be performed by an external software tool such as Synopsys' DesignCompiler or Cadence's Ambit, to generate a list of logic gates and their interconnections of the original circuit, a so-called gate-level netlist of the original circuit. This gate-level netlist (pre-layout netlist) of the original circuit is stored in an intermediate gate-level netlist file, as indicated by reference number 50, as output B.

At software module process step block 60, timing verification is performed, such as with an external simulation tool, like Cadence VerilogXL, and/or static timing analysis tools like Synopsys PrimeTime, to verify that timing constraints (or in general any other kind of constraint, such as speed, power consumption and area constraints) for the design in question are met. If not, as indicated by step decision block 70, a user (and/or a program, if the process is automated) is allowed to modify either the timing constraints and/or the RTL of the circuit, as indicated by procedure block 90.

At software module process step block 80, the software compares the RTL netlist (output A) of process step 20 with the gate-level netlist (output B) of process step 40 and extracts a number of correspondence points between the two netlists (hierarchical reference ports). These correspondence points can be thought of as common points of reference between the two netlists that serve as points of origin or guideposts for subsequent transformations. Correspondence points are the invariant reference points that can be used to create a common point of reference between the two netlists. These correspondence points are useful later in the program to create a common frame of reference. One such correspondence point could be a port. A port is defined in Verilog HDL as an input, output or inout to a module. A module is the basic unit in HDL circuit design, and may be a structural representation, a dataflow representation, a behavioral representation, or any combination of these; typically, gate level netlists are entirely structural while RTL representations are more abstract, along the lines of a dataflow or behavioral representation. Other correspondence points may include points between two netlists that have not changed names, ports that are logically equivalent. In theory, a correspondence point can be any signal/net or registered input/output.

Thus, the EDA software of the present invention at software module process step block 80 outputs a data file called "prelayout correspondence points" (P.C.P), as indicated by reference number 100, referenced as output C, which is reserved for future use.

In software module process step 110, the software of the present invention takes as input the "prelayout correspondence points" data file (output C) of reference number 100, and the design constraints (output A1) of reference number 35, and verifies that all constraints specified in block 35 are defined with respect to the correspondence points identified in process step 80. Generally, any design entity that is referenced in a constraint (a hierarchical port, a net, or a primitive (leaf cell) port) may be in the list of correspondence points.

If the constraints do not reference a recognized correspondence point, one cannot use the same set of constraints for both the RTL and gate-level analysis/simulations, which is a potential problem, as indicated by software module decision block 120. Accordingly, if the constraints do not properly reference one or more correspondence points, new correspondence point must be chosen by the program or manually, as indicated by procedure block 90, so the process is repeated at process step 40. Otherwise, the software passes control to software module block step 130, the layout tool block.

Thus, ideally, invalid constraints (i.e., those constraints that reference design entities that are not considered to be correspondence points) may be made valid by a designer, as indicated by user input at procedure block 90. The software of the present invention would allow user input to change constraints and/or correspondence points automatically or manually.

The layout and physical optimization stage software module block 130 generates a list of changes that were made to the design during layout (e.g., cells that were added, deleted, or replaced and connectivity changes made to accommodate the cell changes, such as creation of new nets, or changing the connection from an original gate to a newly introduced buffer/repeater, and so on). This list of changes output is shown as shown as output D, reference number 140. In addition the layout tools create a database or file that stores the physical implementation (placement and routing data) of the design (output D1, reference block 145) for subsequent use. For example, Cadence Silicon Ensemble is capable of generating a DEF file that captures all of the design data, while Avant! Apollo stores its data in a database known as the Milkyway database.

The netlist generator 150 then takes the pre-layout gate-level netlist, shown as output B, reference number 50, plus the list of changes from output D, reference number 140, and creates a new gate-level netlist that represents what is stored in the layout database, designated as output E, reference number 160, termed the post-layout-netlist. Note that while some layout tools purport to be able to generate a valid post-layout netlist directly from their database, it has been found in practice that these output netlists are not usable, as they often throw away the logic hierarchy (i.e., the output netlist is a flat representation of the design; no intermediate hierarchical modules are preserved). The problem with this is that in order for the designer to do post-layout timing verification, the designer must completely re-tool his testbench (i.e., design constraints) to remove any references to intermediate hierarchical ports. This is a major obstacle for designers since they often define the timing constraints hierarchically so that they can validate portions of the design independently (e.g., divide and conquer) to allow easier debug. So in the present invention there is implemented a post-layout netlist generation tool, as illustrated in box 150, to overcome these shortcomings.

Thus, in view of the above, in block 150 a new gate-level netlist is derived, taking into consideration any changes made by the layout tools (step block 130) and/or by the physical designer. This new gate-level netlist will be referenced again by way of prospective example in FIGS. 2 and 3.

Next, at software module process step module 170, the present invention generates a reference port map, as indicated by software module block 170. The program uses a plurality of inputs to generate a reference port map. These inputs comprise three files: the pre-layout gate-level netlist (output B), the new gate-level netlist (post-layout netlist, output E) and the pre-layout correspondence points (output file C). The reference port map describes how each and every port in the post-layout netlist (output E) relates to ports that existed in the original pre-layout netlist (output B). The generation of this file is done by first comparing the post-layout netlist to the pre-layout correspondence point list to find mismatches. Any point that does not correlate, or any mismatch between the files (e.g., new, missing or renamed module ports in the new netlist versus the list of pre-layout correspondence points) implies there has to be a change at the RTL description of the post-layout (physically implemented/realized) circuit, as well as to the constraints file for this circuit. For example, the tool would identify what "new ports" appear in the post-layout gate-level netlist that were not listed in the pre-layout correspondence point list, in addition to identifying correspondence points listed in the pre-layout list where no port exists in the post-layout gate-level netlist ("missing ports"). Note that a port that has been "renamed" during layout would appear in both the "new ports" list and the "missing ports" list. Once the mismatches have been identified, the tool analyzes both the pre-layout and post-layout netlist to determine logical equivalence between "new" ports and "original" (reference) ports by tracing through both netlists in parallel until a common point of reference is established in the logic cones of the two netlists. This would correspond to finding the nearest register or primary input/output that exists in both versions of the netlist. For most transformations done in layout (i.e., repeater insertion, buffer sizing, clock tree synthesis, etc.) comparing the two logic cones for logic equivalence is trivial (i.e., none of these transformations change the Boolean expression of the logic cone). For operations such as logic restructuring, a more sophisticated Boolean comparison capability may be required.

The output of the process of step block 170 can be stored in an intermediate file that describes the relationship between all ports in the post-layout netlist to the logically equivalent ports original pre-layout netlist, as indicated by output Reference Port Map, output F, of reference number 180.

Next, in software module process step block 190, the present invention takes as inputs the original RTL netlist, output A of reference number 30 from process step 10, and the Reference Port Map, output F from process step block 170, and produces a new post-layout annotated RTL netlist, output G in reference number 200, that correctly corresponds with (and properly maps to) the post-layout gate-level netlist produced during floor planning/layout in process step 150. The new output RTL would incorporate any port renaming and/or port duplication necessary to make the module interfaces consistent with the post-layout gate-level netlist. The output file for this new post-layout annotated RTL netlist is stored as output G, reference number 200, which can simply be called the annotated RTL netlist.

Next, in software module process step 210, the constraint file is modified to conform and comport with the new annotated RTL netlist of output G and the new gate-level netlist of output E. This step can be done with another software tool, or be part of the same tool, and takes as input the original constraint file (output A1), represented by reference number 35, and the Reference Port Map file, output F, generated as output at step 170. The process step block 210 then annotates the original constraints file (ref number 35) by mapping all of the original constraints, such as timing, speed, area, electronic and power constraints, to now reference the hierarchical ports (reference points) of the post-layout gate-level netlist of step 150 (rather than referencing the gate-level netlist of step 40), and outputs the result as output file H, reference number 240, which may be designated as the "annotated constraints" file. This annotated constraints file (output H) properly reflects and comports to the changes made in the new annotated RTL netlist of output file G.

It is not theoretically guaranteed, however, that all constraints can be automatically mapped by the software tool of the present invention. For example, an arrival time on any hierarchical input port of a module can safely be mapped from pre-to-post layout, but a required time or load constraint on a hierarchical output port may not make sense (i.e., the required time for one instance of a replicated output port may be different than that of the original output port requirements on a module, depending on what downstream logic is being driven by the post-layout module port). Similarly, the total load driven by the original output port may now be split between the corresponding replicated ports in the post-layout design. Ultimately, this is an area where human intervention is required, and the present invention allows for human intervention where automatic mapping is impossible. Such human intervention may be requested by the software of the present invention with a suitable error message requesting human input, at any step in the procedure where mapping is done. The input may be made more ergonomic by means of a graphical user interface.

FIG. 1B shows the flowchart for the second general phase of the invention, phase II, where additional ECO changes are made to a circuit. There are two main objective of the invention in this second phase. First, an objective is to preserve as much as possible the various transformations made in the various netlists associated with FIG. 1A so that the physical implementation can be disturbed as little as possible. Second, an objective is to preserve and share the constraints found in the first phase as much as possible, in particular timing constraints.

Thus, proceeding to FIG. 1B (from reference number 250 in FIG. 1A), the second phase of the present invention is shown. Assume now one needs to make a functional change to the design (a functional ECO). This would start a separate design flow in the program of the present invention, the above referenced second general phase, which is labeled the "ECO Flow" (step 260). The idea is that the designer, as shown in block 270, would make the change to the annotated RTL netlist of process step 190 (output G), rather than the original (pre-layout) RTL netlist of step 10. User input may be necessary, for example, to fix a bug found in the design during phase I of the invention, or to otherwise make a last minute change, generally termed an ECO. It is conceivable that user input may also be made automatically, by a computer.

After user input at block 270, the new modified ECO RTL may be stored as output I, as shown by reference number 290. This modified annotated RTL netlist is a ECO RTL netlist and potentially one of a number of ECO RTL netlists generated by the system.

Next, in software module process step box 300, an intermediate or preliminary ECO gate level netlist is generated from the ECO RTL netlist inputted into the software module. The intermediate or preliminary ECO gate level netlist is generated using a logic synthesis tool such as Synopsys DesignCompiler or Cadence Ambit, indicated as output K (reference number 390). In software module 305, timing verification is performed, using the preliminary ECO gate-level netlist, such as with an external simulation tool like Cadence VerilogXL and/or static timing analysis tools like Synopsys PrimeTime, to verify that timing constraints (or in general any other kind of constraint, such as speed, power consumption and area constraints) for the design in question are met. If not, as indicated by the "No" branch of decision block 310, control is passed back to block 350 and a user (and/or a program, if the process is automated) is allowed to modify either the timing constraints and/or the RTL of the circuit, and the process repeats, as per the above.

In software module process step box 320, the ECO RTL netlist is compared to the ECO gate-level netlist to extract the new "prelayout correspondence points" (P.C.P. in FIG. 1B), while in software module process step box 330, the software verifies and validates that constraints for the circuit, as specified in block 370 (output J) are defined with respect to correspondence points identified by process step 320.

In software module decision step 340, a check is made to see if the constraints reference the correspondence points properly; if not, control is passed to user input box 350, where user input is required to modify either the constraints and/or the RTL netlist (which are suitably updated and saved, and the process loops back to step 270 Otherwise, if there is proper reference, the "Yes" branch of decision block 340 is chosen, and the program proceeds to software module process step box 360.

Next, as shown in block 400, the final stage of the program is to use the output generated by the program to produce a final ECO gate-level netlist that is consistent with the ECO RTL netlist (output I, reference number 290, of process step 270), while at the same time incorporating all ECO changes (both functional and non-functional) made by a designer and physical design tools in a manner that preserves as much as possible the structure of the post-layout gate level netlist (output E) created by process step 150 in phase I This new ECO gate-level netlist can be fed into external placement/router tools such as Avant! Apollo or Cadence Silicon Ensemble.

Software module block 400, is preferably is an external program such as the Synopsys EcoCompiler software tool. The Synopsys EcoCompiler utilizes four netlists as input, two RTL netlists and two gate-level netlists. The two RTL netlists are: (1) the post-layout, pre-ECO annotated RTL netlist created by the present invention in step 190, indicated as output G above, and (2) "ECO RTL netlist", output 1, created by the user editing the post-layout annotated RTL netlist, in block 270, that implements a functional ECO. The two gate-level netlists are: (1) the post-layout gate level netlist from phase I above, from step 150, indicated as output E above, and (2) the preliminary ECO gate-level netlist produced by the logic synthesis tool, step 300 above, indicated as output K.

The software module block 400 creates a final gate-level netlist with "minimal" structural changes, generated as output M, reference number 450, that implements the functional ECO change specified at the gate level. This allows the user to preserve the existing layout as much as possible, as it will not force the layout tools to re-implement the gate level transformations made to close timing on portions of the design that are not affected by the new functional ECO.

The ECO gate-level netlist output can be fed to the placement router tools or layout tools, such as by Avant! Apollo or Cadence Silicon Ensemble to implement the incremental changes to the existing layout.

Thus in software module block 460, an external physical optimization and placement router software layout tool such as by Avant! Apollo or Cadence Silicon Ensemble, will take the output of block 400, the "minimal" structural changes final ECO gate-level netlist of reference number 450, and compare it with the gate-level netlist representation stored in the original physical implementation database (output D1) from process step 130 above and produces a list of changes or change list (output not shown in FIG. 1B) that needs to be implemented in the physical design database for the final physical layout of the final ECO circuit. The layout tools then use the change list to drive changes to the physical implementation of the circuit, with user-controllable intervention (i.e., the user may choose to let the layout tool automatically implement the changes based on the design constraints, or may choose to pre-place some of the new cells and/or pre-route some of the new connections introduced by the ECO prior to letting the tool complete the physical implementation of the change list).

In a preferred embodiment of the invention, the HDL description of the present invention utilizes both the netlist of the RTL, the higher-level hierarchy description of the circuit, as well as the lower level hierarchy description, such as the gate-level netlist of the circuit. However, any sets of intermediate level netlists may also be generated (not shown) and the principles of the invention apply equally to them, or to any series of netlists from various hierarchies.

Turning now to a specific prospective example illustrating some of the principles of the present invention. In particular the problems addressed by the present invention associated with block ports that are introduced by layout tools, and how design constraints must be modified to work for a circuit before and after physical optimization.

For this example, we focus on changes made to the gate level netlist as a result of inserting a clock tree into a design. The concepts illustrated in this example are also relevant to other types of physical transformations done by modern layout tools, such as buffer/repeater insertion, net splitting, gate duplication, etc.

Figure 2:
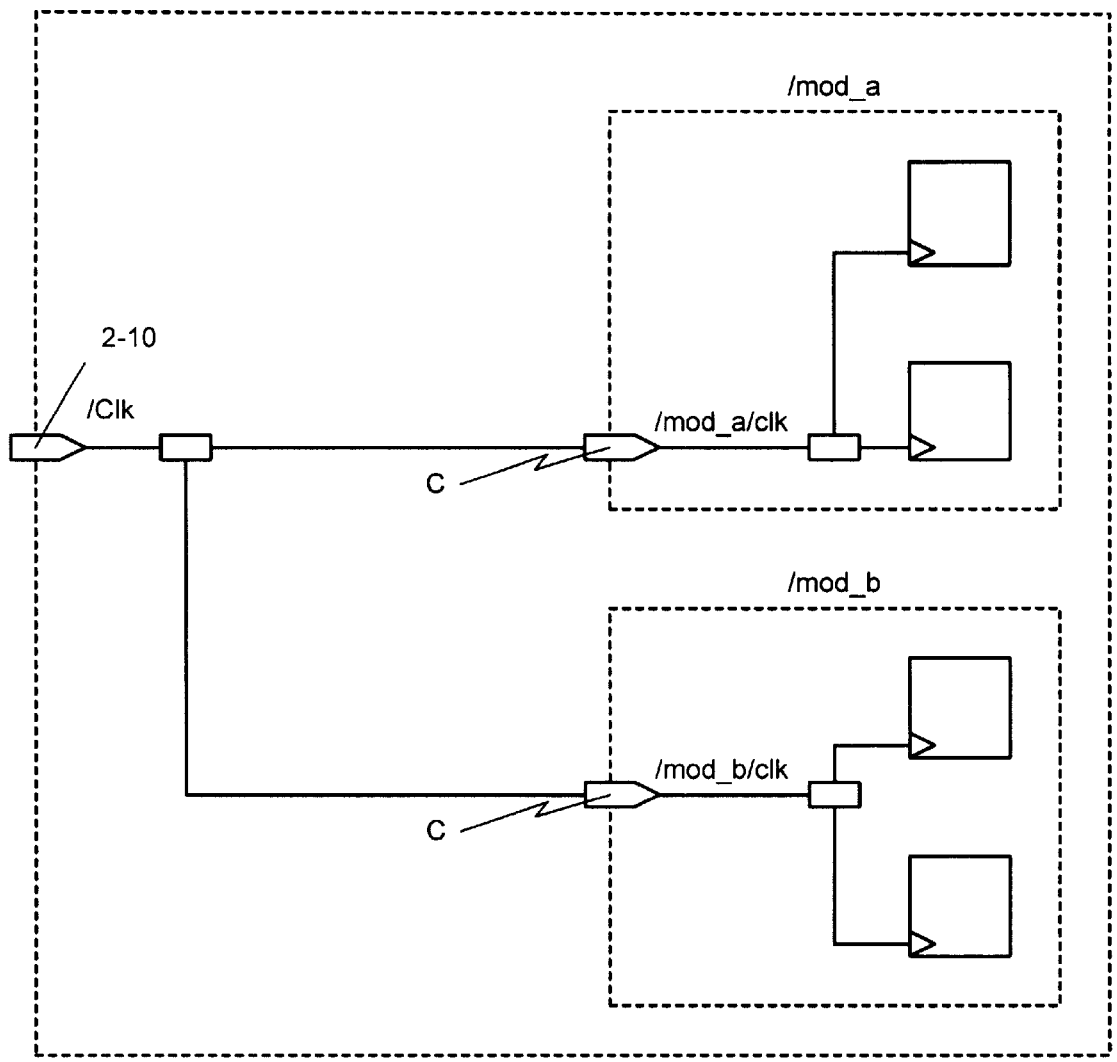
FIG. 2 shows a high level RTL block diagram before annotation for one representative example of the invention, involving clock tree synthesis.
Figure 3:
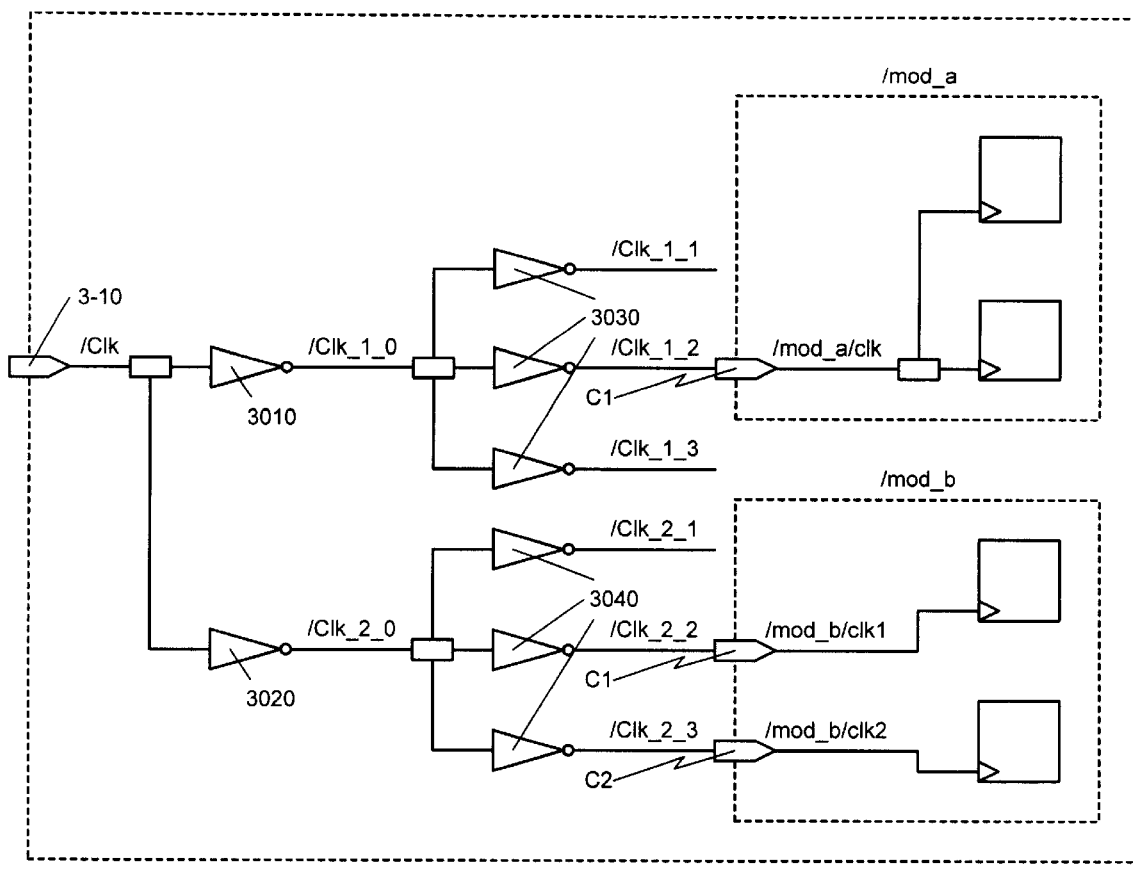
FIG. 3 shows the RTL diagram of FIG. 2 post-annotation.

Clock tree synthesis is an operation where a tool introduces a tree of buffers into a design in an effort to minimize the total propagation delay through the clock distribution network, while also minimizing the skew between clock signal fanout points. This operation is typically done in layout to allow the buffer connectivity and placement to be defined based on the physical locality of the fanout elements (i.e., last stage buffers are placed in the middle of a cluster of flip flops to be driven by the buffer). As can be seen in FIGS. 2 and 3, clock tree synthesis changes the way a clock signal enters and leaves the modules or blocks /mod_a and /mod_b.

FIG. 2 illustrates a schematic of a gate level netlist prior to clock tree insertion, and in FIG. 3 illustrates a schematic of the circuit after clock tree synthesis, to demonstrate how the present invention deals with block ports that may be introduced by layout tools, and how a design may have constraints that incorrectly references ports that no longer exist at the block level.

In FIG. 2 a top level input port (reference no. 2-10) drives a top level signal "/Clk", which is connected to the "C" ports of two blocks, "/mod_a" and "/mod_b". Each of the blocks shown has two flip flops that have their clock pins driven by an internal clock net named "/mod_a/clk" and "/mod_b/clk", respectively, which are driven by the hierarchical input module C ports as shown in FIG. 2. In an actual design there could be many more flip flops and many more levels of logic hierarchy, but this example should suffice to demonstrate the effects on the module interfaces (ports) induced by physical implementation tools.

In FIG. 3 the same top level input port (reference no. 3-10) is shown driving the same top level net "/Clk". However, instead of "/Clk" driving the input pins of the blocks directly, we see a tree of buffers that have been introduced into the design (reference numbers 3010, 3020, 3030 and 3040). As a result, there are new top level nets that were also introduced to the design in order to implement the connectivity of the clock tree: "/Clk" drives two first-stage tree buffers (ref. nos. 3010 and 3020). First stage buffer 3010 drives a new clock net named "/Clk_1_0", which drives three second-stage buffers (reference number 3030) that also drive new clock nets named "/Clk_1_1", "/Clk_1_2", and "/Clk_1_3". Presumably, "Clk_1_1" and "Clk_1_3" would drive additional clock signal fanouts not shown in these schematics. Similarly, first stage buffer 3020 drives a new clock net named "/Clk_2_0", which drives three second-stage buffers (reference number 3040) that also drive new clock nets named "/Clk_2_1", "/Clk_2_2", and "/Clk_2_3". Again, "Clk_2_1" would presumably drive additional clock signal fanouts not shown in these schematics.

The last stage clock tree buffers are then connected to the destination input pins through hierarchical module ports and lower level nets. Specifically, "/Clk_1_2" drives the "C1"

port of block "/mod_a", which then connects to the internal clock net named "/mod_a/clk" which is also connected to the input pins of both of the flip flops in that block. Note, however, that the two flip flops inside of "/mod_b" are now connected to distinct signals as a result of being driven by different last-stage buffers of 3040. This results in two internal clock nets ("/mod_b/clk1" and "/mod_b/clk2" ) driven by two different module ports ("C1" and "C2" respectively).

It is useful to note at this point that all of the newly introduced clock nets in FIG. 3 that were not present in FIG. 2 are "logically equivalent" to the original clock signal "Clk", including the lower level block nets inside of "/mod_a" and "/mod_b". Similarly, all of the module ports introduced as a result of clock tree insertion are logically equivalent to the original "C" ports shown in FIG. 2.

The purpose of the present invention is to identify the relationship between the hierarchical ports pre- and post-layout, and use that information to modify the original RTL and constraints post-layout so that they correspond with the new gate level netlist structure. In this example, we see that port "C1" on "/mod_a" in FIG. 3 can be thought of as having been renamed during layout from the "C" port on "/mod_a" in FIG. 2. Since the original RTL and associated constraints refer to the "C" port in FIG. 2, if we wish to make the RTL and constraints consistent with the new structure of the post-layout gate-level netlist represented by FIG. 3, we need to change any reference to the "C" port of "/mod_a" in the original RTL or constraints to refer to the "C1" port of "/mod_a" now.

The present invention derives the information for this example as follows:

1. Process steps 40, 60, 70, 80, 90 and 110 are performed by the designer prior to going into layout to ensure that all constraints refer only to pre-layout correspondence points (i.e., hierarchical ports). In this example the only relevant pre-layout correspondence points are the "C" port of "/mod_a" and the "C" port of "/mod_b", and the top level input clock port (which are all stored in output C, the P.C.P file). The pre-layout original gate level netlist (output B, which corresponds to the schematic shown in FIG. 2), and the design constraints (output A1) are fed to the layout tools (process step 130) for physical implementation of the circuit.

2. After layout is completed (process step 130) and the post-layout gate level netlist is generated as shown in process step 150, resulting in output D that corresponds to the schematic shown in FIG. 3.

3. In process step 170, the pre-layout correspondence points are found to be the top level input port and the C ports of the two modules "/mod_a" and "/mod_b" from the P.C.P file. At this point the original gate level netlist (output B) and post-layout gate level netlist (output D) are analyzed to determine reference port relationships for each of the correspondence points listed in the P.C.P. This can be done in a variety of ways:

The module interfaces can be compared, and where ports are identical, the reference mapping is a null mapping (i.e. the same port exists in both the pre- and post-layout netlist representation). Where they are different, the connectivity can be analyzed in both netlists in parallel until a common point of reference is reached (i.e., a primary input of the chip, or a primitive memory element) that has functional equivalency. Since for buffers the input and outputs of these cells are logically equivalent, determining functional equivalency of paths that are different by only buffers (like clock trees) is trivial. A slightly more sophisticated comparison mechanism may be needed where inverting buffers and/or gate duplication is performed.

For this example, it would be determined that input port "C1" of "/mod_a" in the post-layout netlist is logically equivalent to input port "C" of "/mod_a" in the pre-layout (original) gate level netlist. Similarly, it would be determined that input port "C1" of "/mod_b" and input port "C2" of "/mod_b" in the post-layout netlist are logically equivalent to input port "C" of "/mod_b" in the pre-layout (original) gate level netlist.

Next, if there are duplicate post-layout ports (as in the case for "/mod_b"), one of the ports is selected to be the "reference" port in the post-layout representation. For later annotation, the reference port will be substituted wherever the corresponding pre-layout (original) port is referenced in the RTL and/or constraint files. The other duplicate (logically equivalent) module ports in the post-layout representation are then defined in the annotated RTL and/or constraints relative to the reference port.

4. Finally, a reference port map (output F) is created for use later during annotation operations.

Once the necessary comparison of the post-layout gate level netlist of FIG. 3 is made to the original gate level netlist of FIG. 2 on a module-by-module basis, and a determination of logical relationships between the ports of the post-layout netlists and the ports of the original netlists is made, then one of the original RTL module ports is renamed as a reference origin port. In the example of FIG. 3, possible reference port renaming operations (symbolized by the symbol "→" below) can be as follows:

original port C on /mod_a (FIG. 2) →post-layout port C1 on /mod_a (FIG. 3) or, original port C on /mod_b (FIG. 2) →post-layout port C1 on /mod_b (FIG. 3)

In either case, either of the ports referenced on the right-hand side become a "reference port" from which new constraints can be defined for all of the other duplicate module level ports on each module (e.g., in FIG. 3, port C2 at internal net /mod_b/clk2), such that the arrival time of the signals at those ports are coincident with the arrival time at the reference port.

Thus, for the example of FIG. 3, the program would know, by comparing the logical relationships of the original netlist with the post-layout netlist, that the signal for the clock net /mod_b/clk1 must arrive at port C1 at exactly the same time that the signal for the clock net /mod_b/clk2 arrives at port C2 (since the two ports are logically duplicates of the original port C of /mod_b in FIG. 2). Therefore, using parameters for a particular reference port (e.g., using either port C of /mod_a or port C of /mod_b), the software program of the present invention can deduce what the parameters for timing constraints would be for other ports. For example, suppose the reference port was chosen to be port C1 of /mod_b in FIG. 3, and the arrival time or delay (any combination of gate delays, net delays and/or module path delays) from port 3-10 to port C1 of /mod_b is 10 time units. Then the delay for port C2 of /mod_b is also 10 time units. Moreover, since fanout branch clock net /Clk_2_1 is a duplicate of branches /Clk_2_2 and /Clk_2_3, any port on the same level for /Clk_2_1 would also have a delay of 10 time units.

To extend this concept even further, the post layout annotation tool of the present invention could be smart enough to adjust the arrival times in module constraints to account for the introduction of buffering at higher levels of logic hierarchy resulting from layout transformations. For example, in the circuit above, since the insertion delay of the clock tree is known after layout, the constraint at the module level could be adjusted to reflect the actual arrival time of the signal, rather than the 'budget' provided pre-layout. That is, when doing top down design, one can estimate how much time will needed to get the clock signal to the input of a particular module. During pre-layout, one does this by establishing a budget at each level of hierarchy that synthesis is run at. However, post-layout one can calculate exactly how much time it takes to get the signal all the way to the module port. Therefore, if one needs to resynthesize a module in order to implement a functional ECO, one could use that actual propagation delay value rather than the pre-layout estimate (i.e., the budget). This re-budgeting could be reflected on all duplicate module ports, or by using the exact timing to that port extracted from layout.

In addition, it should be noted that logic transformations within a module do not result in new ports at a higher-level hierarchical module, thus decreasing the number of translations in terms of the new reference origin port. Further, if one ensures that any constraints defined in the module are relative to primary inputs or register inputs/outputs, it is guaranteed that the timing constraints will not have to change after local logic restructuring, because local logic restructuring only deals with combinational logic gates, not sequential elements.

Furthermore, for the special case of clock signals where the tree is distributed across hierarchical boundaries (instead of at a single level as depicted in the example above), because of the periodic nature of clock signals, intermediate clock tree nets can always be described relative to the original "root" signal with a phase relationship (even if inverters are used to build the tree).

Figure 4:
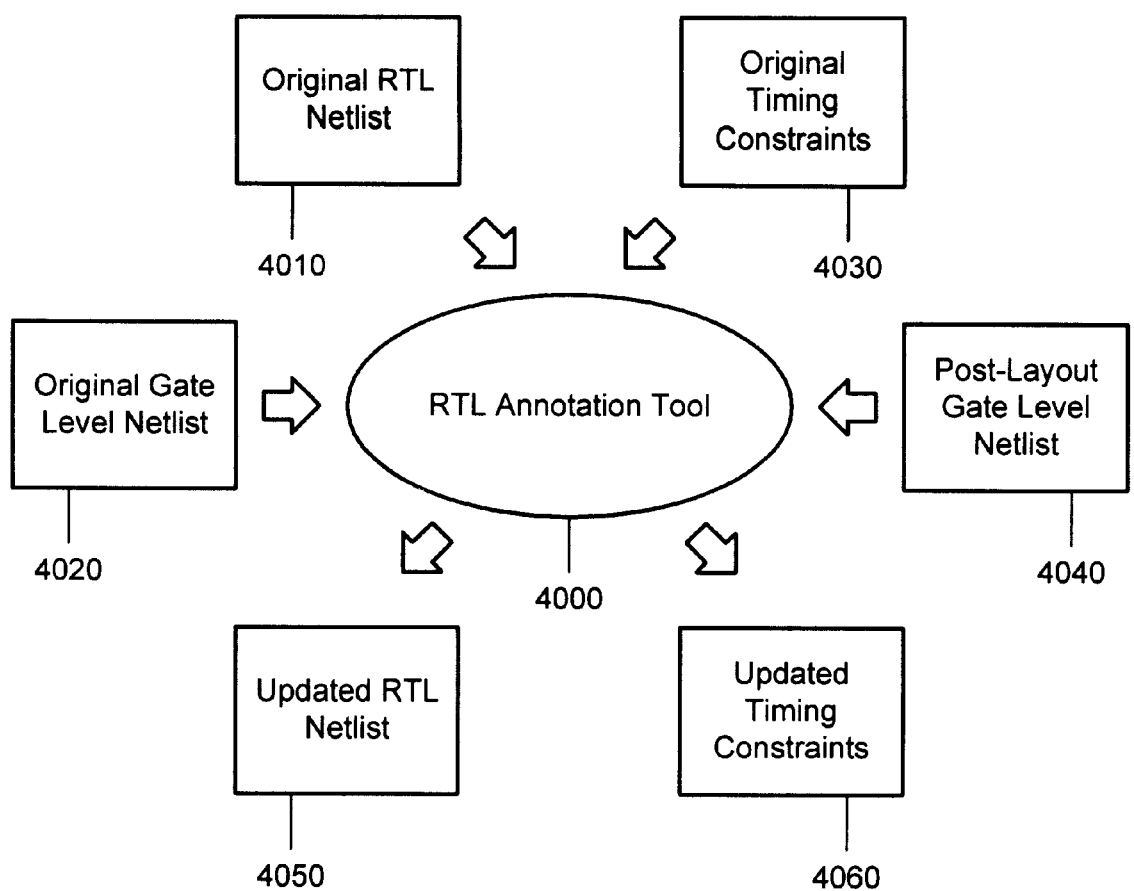
FIG. 4 shows a block diagram of the data flow for an embodiment of the annotation tool of the present invention.

FIG. 4 shows a high-level data flow diagram of inputs and outputs for a portion of the software annotation tool of the present invention. The software RTL annotation tool 4000 receives as input the original RTL netlist 4010, the original gate level netlist 4020, the original timing constraints for the original (pre-annotation) netlist 4030, the post-layout gate level netlist 4040, and outputs the new updated RTL netlist 4050 and updated timing constraints 4060 from the information provided by the various processes within the annotation tool application, based on the inputs provided.

Though the preferred embodiments are disclosed in the present invention, alternative mechanisms may be employed without departing from the scope of the invention. For example, though in a preferred prospective example a clock tree synthesis transformation was given, the principles of the netlist transformation of the present invention can be used for buffer repeater insertion (which can be viewed as a simplified tree with only one branch at each node level), gate duplication, and even logic restructuring. It is to be understood that while the invention has been described above in conjunction with preferred specific embodiments, the description and examples are intended to illustrate and not limit the scope of the invention, which is defined by the scope of the appended claims.

I claim:

1. In a software system, an Electronic Design Automation (EDA) software application program for facilitating an Engineering Change Order (ECO), said software program comprising:

a circuit description described in a hardware description language (HDL) comprising a pre-ECO circuit description comprising a pre-ECO Register Transfer Level (RTL) netlist, and a ECO circuit description comprising an ECO circuit RTL netlist, said ECO circuit RTL netlist representing said pre-ECO RTL netlist modified by an ECO;

an ECO RTL netlist software module for generating said ECO RTL netlist;

a final ECO gate-level netlist synthesis software module for generating and outputting a final ECO gate-level netlist, said ECO gate-level netlist corresponding to said ECO RTL netlist and describing said ECO circuit.

2. The invention according to claim 1, further comprising:

a pre-ECO constraints file that specifies pre-ECO constraints for said pre-ECO circuit description;

a post layout, pre-ECO gate-level netlist generating software module for generating a post-layout, pre-ECO gate-level netlist;

an annotated constraints file software module that specifies constraints for said post-layout, pre-ECO gate-level netlist;

said post-layout, pre-ECO gate-level netlist conforming to said annotated constraints.

3. The invention according to claim 2, further comprising:

a post-layout, pre-ECO annotated RTL netlist generating software module for generating a post-layout, pre-ECO RTL netlist that corresponds to said post-layout, pre-ECO gate-level netlist.

4. The invention according to claim 2, further comprising:

a ECO constraints file that specifies constraints for said ECO circuit description;

a modified ECO constraints file software module for modifying said ECO constraints file to produce a modified ECO constraints file that specifies modified ECO constraints for said ECO circuit;

a ECO gate-level netlist generating software module for generating and outputting a post-layout, ECO gate-level netlist that conforms to said modified ECO constraints file.

5. The invention according to claim 1, further comprising:

a pre-ECO gate-level netlist generating software module for generating a pre-ECO pre-layout gate-level netlist of said pre-ECO circuit, said pre-ECO gate-level netlist conforming to said pre-ECO constraints file;

a prelayout correspondence points software module for comparing an RTL netlist with a gate-level netlist, finding common points of reference between the RTL netlist and the gate-level netlist, and outputting these common points of reference as prelayout correspondence points data, said prelayout correspondence points software module outputting a first prelayout correspondence points file comprising common points of reference between the pre-ECO RTL netlist and said pre-ECO gate-level netlist of said pre-ECO circuit.

6. The invention according to claim 5, further comprising:

a reference port map generating software module for generating a reference port map that compares pre-layout netlists, wherein said reference port map generating software module receives as inputs (1) said pre-ECO, pre-layout gate-level netlist, (2) said post-layout, pre-ECO gate-level netlist, and (3) said first prelayout correspondence points file, wherein said reference port map generating software module outputs said reference port map that relates said post-layout pre-ECO gate-level netlist to said pre-ECO, pre-layout gate-level netlist.

7. The invention according to claim 5, further comprising:
a post-layout pre-ECO RTL netlist software module for generating and outputting a post-layout, pre-ECO RTL netlist that corresponds to said post-layout, pre-ECO gate-level netlist that conforms to said annotated constraints file, said post-layout pre-ECO RTL netlist receiving as input said reference port map.

8. The invention according to claim 2, further comprising:
a post-layout pre-ECO RTL netlist software module for generating and outputting a post-layout, pre-ECO RTL netlist that corresponds to said post-layout, pre-ECO gate-level netlist that conforms to said annotated constraints file.

9. The invention according to claim 1, further comprising:
a placement router/physical optimization software tool module, said placement router/physical optimization software tool module receiving as input said final ECO gate-level netlist and outputting a list of changes for the final physical layout of the ECO circuit description.

10. The invention according to claim 9, wherein:
said placement router/physical optimization software tool module is an external application to the EDA software tool comprising the invention.

11. The invention according to claim 1, further comprising:
a prelayout correspondence points software module for comparing an RTL netlist with a gate-level netlist, finding common points of reference between the RTL netlist and the gate-level netlist, and outputting these common points of reference as prelayout correspondence points data.

12. The invention according to claim 11, further comprising:
said prelayout correspondence points software module comprises a ECO pre-layout correspondence points software module, said ECO prelayout correspondence points software module comparing said ECO RTL netlist with said ECO gate-level netlist of the ECO circuit, finding common points of reference between the ECO RTL netlist and the ECO gate-level netlist, and outputting these common points of reference as ECO prelayout correspondence points data.

13. The invention according to claim 11, further comprising:
a gate-level netlist generating software module for generating a pre-ECO gate-level netlist of said pre-ECO circuit;
said prelayout correspondence points software module comprises a first, pre-ECO prelayout correspondence points software module for comparing said pre-ECO RTL netlist with said gate-level netlist of said pre-ECO circuit, finding common points of reference between the pre-ECO RTL netlist and the pre-ECO gate-level netlist, and outputting these common points of reference as pre-ECO prelayout correspondence points data.

14. The invention according to claim 13, wherein:
said prelayout correspondence points software module comprises a second, ECO pre-layout correspondence points software module, said second prelayout correspondence points software module comparing said ECO RTL netlist with said ECO gate-level netlist of the ECO circuit, finding common points of reference between the ECO RTL netlist and the ECO gate-level netlist, and outputting these common points of reference as ECO prelayout correspondence points data.

15. The invention according to claim 1, further comprising:
timing constraints data associated with said ECO gate-level netlist;
a user input software module for modifying said timing constraints data and for modifying said ECO RTL netlist;
a timing verification decision block software module for verifying said timing constraints are satisfied by said ECO gate-level netlist, wherein, upon said timing constraints not being satisfied by said ECO gate-level netlist, said EDA software application tool passes control of said EDA program to said user input software module so a user may modify said timing constraints and said ECO RTL netlist.

16. The invention according to claim 1, further comprising:
a pre-ECO constraints file that specifies constraints for said pre-ECO circuit description;
an annotated constraints file software module for modifying said pre-ECO constraints file to produce an annotated constraints file that specifies constraints for said pre-ECO circuit;
a user input pre-ECO software module for generating said pre-ECO RTL netlist, and for modifying said pre-ECO constraints file, wherein said user input pre-ECO software module allows allow modification of said pre-ECO RTL netlist and said pre-ECO constraints file.

17. The invention according to claim 1, further comprising:
a ECO constraints file that specifies constraints for said ECO circuit description;
an modified constraints file software module for modifying said ECO constraints file to produce a modified constraints file that specifies constraints for said ECO circuit;
a user input ECO software module for generating said ECO RTL netlist, and for modifying said ECO constraints file, wherein said user input ECO software module allows allow modification of said ECO RTL netlist and said ECO constraints file.

18. The invention according to claim 17, further comprising:
a decision block and comparison software module for comparing said ECO prelayout correspondence points data with said constraints file, wherein, upon the correspondence points data not properly match the constraints file, said decision block and comparison software module passes control of said EDA program to said user input ECO software module to allow modification of said ECO RTL netlist and said constraints file.

19. The invention according to claim 12, further comprising:
a constraints file that specifies constraints for said circuit description;
wherein said user input ECO software module allows allow modification of said ECO RTL netlist and said constraints file;
a decision block and comparison software module for comparing said ECO prelayout correspondence points data with said constraints file.

20. The invention according to claim 3, further comprising:
a first ECO software module for modifying said pre-ECO RTL netlist to produce a first ECO RTL netlist;

a user input-ECO RTL software module for modifying said first ECO RTL netlist;

a preliminary ECO RTL netlist software module for generating a preliminary ECO RTL netlist different from said first ECO RTL netlist in response to said user input ECO RTL software module;

a preliminary ECO gate-level netlist software module for generating a preliminary ECO gate-level netlist corresponding to said preliminary ECO RTL netlist;

said final ECO gate-level netlist synthesis software module generates a final ECO gate-level netlist that satisfies said modified constraints file, said gate-level netlist generating software module receiving as input: (1) said post-layout, pre-ECO RTL netlist; (2) said first ECO RTL netlist; (3) said post-layout, pre-ECO gate-level netlist; and (4) said preliminary ECO gate-level netlist.

21. The invention according to claim 1, further comprising:

a reference port map generating software module for generating a reference port map that compares pre-layout netlists;

a constraints file that specifies constraints for said circuit description;

a pre-ECO gate-level netlist generating software module for generating a pre-ECO gate-level netlist;

wherein said gate-level netlist generating software module for generating a pre-ECO gate-level netlist of said pre-ECO circuit generates a first pre-ECO gate-level netlist prior to any modifications, and generates a second pre-ECO gate-level netlist that is different from said first pre-ECO gate-level netlist, said gate-level netlist generating software module generates said second pre-ECO gate-level netlist that satisfies said constraints file of said circuit description, and said second pre-ECO gate-level netlist satisfying said constraints in response to modifications to said pre-ECO circuit RTL netlist;

wherein said reference port map software module receives as inputs said first and second pre-ECO gate-level netlists, and said prelayout correspondence points software module and said reference port map software module outputs a reference port map file that maps the differences between said first and second pre-ECO gate-level netlists.

22. The invention according to claim 21, further comprising:

an annotated pre-ECO RTL netlist generating software module for generating a file containing the annotated pre-ECO RTL netlist that corresponds to said second pre-ECO gate-level netlist, said annotated RTL pre-ECO netlist taking as inputs said first pre-ECO RTL netlist and said reference port map file.

23. The invention according to claim 22, further comprising:

a annotated pre-ECO constraints file software module for generating an annotated pre-ECO constraints file that comports to said annotated pre-ECO RTL, said annotated pre-ECO constraints file software module receiving as input the pre-ECO constraints for said pre-ECO circuit and said file containing said annotated pre-ECO RTL netlist.

24. A computer system running a Electronic Design Automation (EDA) software tool application comprising:

a computer having a processor and memory;

a software application, run by said computer processor, and residing in said computer memory;

data comprising a circuit description described in a hardware description language (HDL), said circuit description comprising a pre-ECO circuit description and an ECO circuit description, said ECO circuit description being said pre-ECO circuit description modified by an Engineering Change Order (ECO);

a pre-ECO constraints file that specifies pre-ECO constraints for said pre-ECO circuit description, and a ECO constraints file that specifies ECO constraints for said ECO circuit;

said software application comprising a plurality of software function modules comprising:

a pre-ECO circuit register transfer level (RTL) netlist software module within said application for generating a pre-ECO RTL netlist description of said pre-ECO circuit description, said pre-ECO RTL netlist conforming to said pre-ECO constraints file;

a pre-ECO circuit gate-level netlist software module within said application for generating a gate-level netlist description of said pre-ECO circuit, said pre-ECO circuit gate-level netlist conforming to said pre-ECO constraints file;

an ECO RTL netlist software module for generating an ECO RLT netlist description of said ECO circuit, said ECO RTL netlist conforming to said ECO constraints file;

a final ECO gate-level netlist software module for generating and outputting a final gate level netlist of said ECO circuit that corresponds to said ECO RTL netlist and that satisfies said ECO constraints file.

25. The invention according to claim 24, further comprising:

a placement/router software module for physical optimization and layout of the circuit corresponding to said final ECO gate-level description.

26. The invention according to claim 24, further comprising:

a user input software module for modifying constraints associated with said circuit description and for modifying said RTL netlist, in response to user input.

27. The invention according to claim 24, further comprising:

a prelayout correspondence points software module for comparing an RTL netlist with a gate-level netlist, finding common points of reference between the RTL netlist and the gate-level netlist, and outputting these common points of reference as prelayout correspondence points data.

28. The invention according to claim 27 further comprising:

said prelayout correspondence points software module comprises a first prelayout correspondence points software module for comparing said pre-ECO, pre-ECO RTL netlist with said gate-level netlist of said pre-ECO, pre-ECO circuit, finding common points of reference between the pre-ECO RTL netlist and the pre-ECO gate-level netlist, and outputting these common points of reference as pre-ECO prelayout correspondence points data.

29. The invention according to claim 28 further comprising:

said prelayout correspondence points software module comprises a second prelayout correspondence points software module, said second prelayout correspondence points software module comparing said ECO RTL netlist with said ECO gate-level netlist of the ECO circuit, finding common points of reference between the ECO RTL netlist and the ECO gate-level netlist, and outputting these common points of reference as ECO prelayout correspondence points data.

30. The invention according to claim 27, further comprising:
a user input software module for modifying constraints associated with said circuit description and for modifying said RTL netlist, in response to user input;
a decision block and comparison software module for comparing said ECO prelayout correspondence points data with said ECO constraints file, wherein, upon said ECO constraints not properly referencing the prelayout correspondence points, said decision block and comparison software module passes control of said EDA program to said user input software module to allow modification of said ECO RTL netlist and said ECO constraints file.

31. The invention according to claim 30, wherein:
said prelayout correspondence points software module comprises a second prelayout correspondence points software module, said second prelayout correspondence points software module comparing said ECO RTL netlist with said ECO gate-level netlist of the ECO circuit, finding common points of reference between said ECO RTL netlist and said intermediate ECO gate-level netlist, and outputting these common points of reference as ECO prelayout correspondence points data.

32. The invention according to claim 28, wherein:
a reference port map generating software module for generating a reference port map that compares pre-layout netlists; wherein said reference port map generating software module receives as inputs (1) said pre-ECO gate-level netlist, (2) said post-layout, pre-ECO gate-level netlist, and (3) said first prelayout correspondence points file, and said reference port map outputs said reference port map that relates said post-layout pre-ECO gate-level netlist to said pre-ECO gate-level netlist.

33. The invention according to claim 32, further comprising:
a post-layout pre-ECO RTL netlist software module for generating and outputting a post-layout, pre-ECO RTL netlist that corresponds to said post-layout, pre-ECO gate-level netlist that conforms to said pre-ECO constraints file, said post-layout pre-ECO RTL netlist receiving as input said reference port map.

34. A software method of generating Register Transfer Level (RTL) and gate-level netlists in response to an ECO to a circuit, comprising the steps of:
generating a hardware description language (HDL) description of a circuit, said HDL circuit description comprising a pre-ECO circuit description and an ECO circuit description, said ECO circuit description being said pre-ECO circuit description modified by an Engineering Change Order (ECO);
generating an ECO circuit RTL netlist description of said ECO circuit;
generating an ECO circuit preliminary gate-level netlist description of said ECO circuit;
comparing said ECO circuit RTL netlist to said ECO circuit preliminary gate-level netlist to extract and generate ECO prelayout correspondence points;
reading data comprising a ECO constraints file representing constraints for said ECO circuit;
comparing said ECO prelayout correspondence points with said ECO constraints to verify said ECO constraints match said ECO prelayout correspondence points;
generating a ECO circuit final gate-level netlist of said ECO circuit, said final gate-level netlist representing said ECO circuit satisfying said ECO constraints file.

35. The method according to claim 34, further comprising the step of:
generating a pre-ECO circuit RTL netlist description of said pre-ECO circuit description;
generating a pre-ECO gate-level netlist description said pre-ECO circuit;
comparing said pre-ECO circuit RTL netlist to said pre-ECO circuit gate-level netlist to extract and generate pre-ECO prelayout correspondence points;
reading data comprising a pre-ECO constraints file representing constraints for said pre-ECO circuit;
comparing said pre-ECO prelayout correspondence points with said pre-ECO constraints of said pre-ECO circuit to verify said pre-ECO constraints match said pre-ECO prelayout correspondence points;
modifying said pre-ECO constraints file of said pre-ECO circuit to produce a modified pre-ECO constraints file;
generating a post-layout gate-level netlist of said pre-ECO circuit, using said modified pre-ECO constraints file.

36. The method according to claim 35, further comprising the step of:
generating a reference port map that compares gate-level netlists, comprising the steps of:
generating a pre-ECO, pre layout gate-level netlist of the pre-ECO circuit, which is subject to
said pre-ECO, pre-ECO constraints file prior to any modification;
comparing the following output files, comprising: (1) said pre-ECO, pre-layout gate-level netlist of the pre-ECO circuit; (2) said pre-ECO post-layout gate-level netlist of said pre-ECO circuit, which is subject to said modified pre-ECO constraints file; and (3) said pre-ECO prelayout correspondence points;
generating a relationship, using said pre-ECO prelayout correspondence points, between (1) said pre-ECO, pre-layout gate-level netlist of the pre-ECO circuit and (2) said pre-ECO, pre-layout said post-layout gate-level netlist of said pre-ECO circuit;
outputting said relationship of said reference port map as a reference port map output file.

37. The method according to claim 36, further comprising the step of:
providing said final gate-level netlist as input to a placement router/physical optimization software tool module, said placement router/physical optimization software tool;
outputting the placement, routing and physical optimization components from said placement router/physical optimization software tool.

38. A software application for Electronic Design Automation (EDA) comprising:
a circuit described in a hardware description language (HDL) comprising a pre-ECO circuit description comprising a pre-ECO Register Transfer Level (RTL) netlist, and a ECO circuit description comprising an ECO circuit RTL netlist, said ECO circuit RTL netlist representing said pre-ECO RTL netlist modified by an ECO;

a constraints file that specifies constraints for said pre-ECO circuit description;

means for generating said pre-ECO RTL netlist;

means for generating a pre-ECO gate-level netlist corresponding to said pre-ECO RTL netlist;

means for generating said ECO circuit RLT netlist;

means for generating a ECO gate-level netlist corresponding to said ECO RTL netlist;

a ECO constraints file that specifies constraints for said ECO circuit description;

means for generating a final ECO gate-level netlist, said ECO gate-level netlist corresponding to said ECO RTL netlist and conforming to said ECO constraints file, wherein said means for generating said final ECO gate-level netlist substantially preserves said pre-ECO RTL and pre-ECO gate-level netlists.

39. The invention according to claim 38, further comprising:

means for modifying said ECO constraints file to produce a modified constraints file that specifies constraints for said ECO circuit;

means for allowing user input to modify said ECO constraints file, wherein said user input means allows allow modification of said ECO RTL netlist and said ECO constraints file, wherein said means for allowing user input are iterative.

* * * * *